United States Patent [19]

Kowalski

[11] Patent Number: 4,827,450
[45] Date of Patent: May 2, 1989

[54] INTEGRATED CIRCUIT WITH MEMORY COMPRISING A FRAUD-PREVENTION DEVICE

[75] Inventor: Jacek A. Kowalski, Trets, France

[73] Assignee: SGS-Thomson Microelectronics S.A., Gentilly, France

[21] Appl. No.: 218,670

[22] Filed: Jul. 13, 1988

[30] Foreign Application Priority Data

Jul. 21, 1987 [FR] France ................. 87 10286

[51] Int. Cl.$^4$ ............................ G11C 11/40
[52] U.S. Cl. ................... 365/185; 365/210
[58] Field of Search ................. 365/185, 210

[56] References Cited

U.S. PATENT DOCUMENTS

| | | | |
|---|---|---|---|
| 4,612,630 | 9/1986 | Rosier | 365/201 |
| 4,612,632 | 9/1986 | Olson | 365/226 |
| 4,761,765 | 8/1988 | Hashimoto | 365/210 |

*Primary Examiner*—James W. Moffitt
*Attorney, Agent, or Firm*—Roland Plottel

[57] ABSTRACT

Disclosed is an integrated circuit comprising an electrically erasable programmable memory, the cells of which comprise a transistor with floating gate which is series connected with an access transistor, wherein, in order to prevent deterioration in the information stored in the transistors with floating gates, due to an excessive read voltage being applied to the cell, the circuit has, firstly, an additional cell constituted like the other cells and programmed in a state where its transistor with floating gate cannot be made conductive, the gate and the source of the transistor with floating gate of the additional cell being grounded, the drain and the gate of the access transistor receiving the memory reading voltage, and, secondly, a threshold comparator connected to the drain of the floating gate transistor to compare the voltage on this drain with the reading voltage and to give a signal in the event of any abnormal drop in the voltage at the drain. The invention can be applied to integrated circuits with memory.

3 Claims, 2 Drawing Sheets

INTEGRATED CIRCUIT WITH MEMORY COMPRISING A FRAUD-PREVENTION DEVICE

BACKGROUND OF THE INVENTION

1. Field of the Invention

The present invention concerns integrated circuits with memory, comprising a fraud-prevention device.

2. Description of the Prior Art

Many integrated circuits with memories have non-volatile memories of the EPROM type, that is, erasable programmable read-only memories that are erasable by exposure to ultra-violet radiation, or of the EEPROM (or electrically erasable programmable read-only memory) type.

The present trend is towards the increasing use of EEPROMs because of their advantages over EPROMs. These advantages include, especially, the fact that the erasure is done electrically, the programming time of these memories which is ten times shorter than for EPROM memory cells, the fact that their programming current is zero and also the possibility they offer of using a programming voltage generated inside the circuit from the Vcc supply voltage of the memory cells.

EEPROM cells are programmed by a programming voltage Vpp having a value of about 20 volts. Although the programming voltage used is 20 volts, the EEPROM cells are programmed at voltages which are below 20 volts and may reach 10 volts. Using a voltage of 20 volts ensures a level acceptable to the threshold voltage $V_t$ of each memory cell.

Now, it so happens that CMOS technology is used in most integrated circuits. As compared with NMOS technology, CMOS technology enables a considerable reduction in static consumption and an increase in speed and in the range of the supply voltage at which the circuit works.

In practice, the operating range of CMOS circuits is from 2V to 15V. The supply voltage of circuits of this type may therefore range from 2 volts to 15 volts. It can be seen that voltages at these levels are of a magnitude sufficient for programming or are even greater than this programming threshold voltage. Now, the use of supply voltages close to or greater than this programming threshold voltage damages the information contained in the memory. Supply voltages at this level are excessive.

A fraudulent person might therefore think of using this phenomenon, during the reading of memory cells, to alter the state of the information contained in these cells by increasing the supply voltage so as to destroy information, inconvenient to him, such as confidential codes or information concerning a bank account.

The invention can be used to resolve this problem, not by preventing the supply voltage from reaching the programming threshold beyond which the reading operation is converted into an operation for writing the memory partially or entirely but, in an unexpected way, by providing an additional or a warning cell in the memory connected to a sensor comprising a threshold comparator which permanently receives information on the state of the warning cell, with the output signal of the sensor either turning off the internal clock of the circuit or triggering an interruption in the internal logic so as to protect the memory as soon as there is a change in the detected voltage.

SUMMARY OF THE INVENTION

An object of the invention therefore is an integrated circuit comprising an electrically erasable programmable memory, the cells of which comprise a transistor with floating gate which is series connected with an access transistor, wherein, in order to prevent deterioration in the information stored in the transistors with floating gates due to excessive read voltage being applied to the cell, the circuit has an additional cell constituted like the other cells and programmed in a state where its transistor with floating gate cannot be made conductive, the gate and the source of the transistor with floating gate of the additional cell being grounded, the drain and the gate of the access transistor receiving the memory reading voltage, and a threshold comparator connected to the drain of the floating gate transistor to compare the voltage on this drain with the reading voltage and to give a signal in the event of any abnormal drop in the voltage at the drain.

BRIEF DESCRIPTION OF THE DRAWINGS

The invention will be better understood from the following detailed description, which is given as an example which in no way restricts the scope of the invention and is made with reference to the appended drawings, of which.

DESCRIPTION OF A PREFERRED EMBODIMENT

To make the description easier to understand, a very schematic depiction of an integrated circuit CI comprising an EEPROM type memory M, that is, an electrically erasable programmable read-only memory is given hereinafter.

The memory M has a set of memory cells C1, C12 . . ., C21, arranged in a matrix of rows and columns. Each cell can be selected by a word line WL1, WL2 . . . and by a data line or bit line BL1, BL2 . . .

Figure 1:
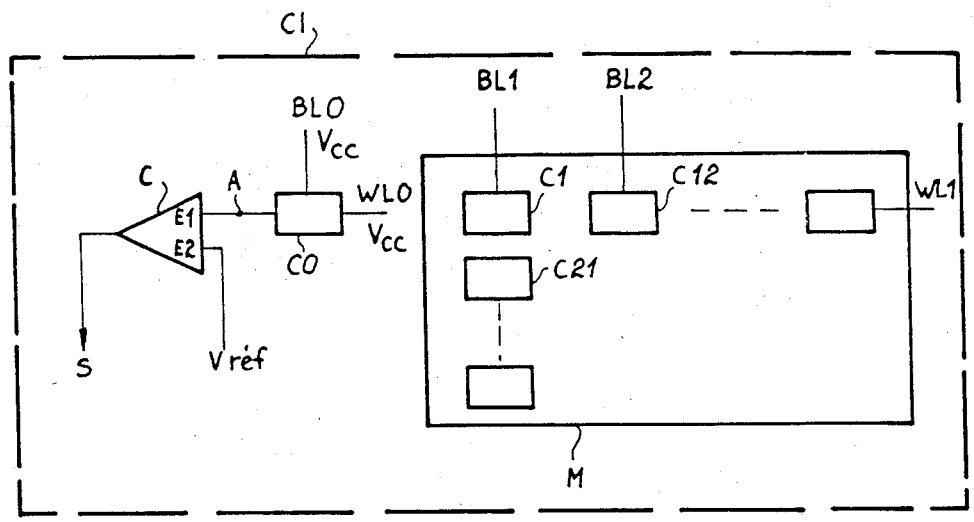
FIG. 1 shows a general diagram of an integrated circuit according to the invention.
Figure 2:
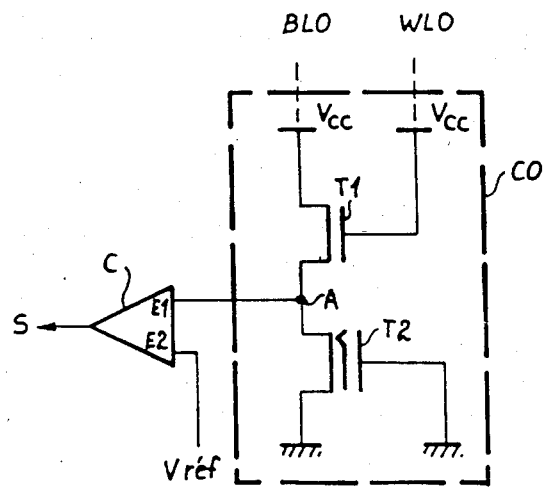
FIG. 2 shows a more detailed diagram of a warning cell according to the invention.

According to the invention, the integrated circuit CI has an additional cell called a warning cell CO which is set aside to shield the cells of the memory against any deterioration of stored information through an excessive level of memory reading voltage. The warning cell CO may be constituted by a cell of the memory which can be selected by a word line WLO and a bit line BLO or by a cell outside the memory. As shown in FIG. 2, this warning cell CO has an access transistor T1 and a transistor T2 with floating gate.

According to the invention, the integrated circuit further has a comparator C which receives the signal read in the warning cell CO at one input terminal E1 and the reference signal Vref at another input terminal E2. The reference signal Vref is equal to the voltage present at the drain of the transistor T2 with floating gate when this transistor is programmed at "1" and when it is made non-conductive.

The drain voltage of the transistor with floating gate is equal to the memory reading voltage Vcc minus the threshold voltage Vt when the cell comprises an n-channel MOS type access transistor. This reference signal Vref is equal to the read voltage Vcc when the cell comprises a p-channel MOS type access transistor.

The comparator C gives a signal S when the input voltage E1 is lower than the reference voltage. The comparator C therefore gives a signal S when the input voltage E1 becomes lower than the voltage Vcc-Vt in the case of an n-channel MOS access transistor or when this voltage becomes lower than the reading voltage Vcc.

The principle by which the invention works is given in detail by means of FIG. 2 which represents the warning cell CO and the comparator C. The warning cell CO therefore has an access transistor T1 (an n-channel MOS or a p-channel MOS transistor) and a transistor T2 with floating gate. The node A formed by the drain of the transistor T2 and the source of the transistor T1 is connected to the input E1 of the comparator C. The cell has been programmed in a state such that the transistor with floating gate cannot be made conductive. Thus the cell is programmed in the state "1" which corresponds to a threshold voltage Vt of the transistor T2 equal to 5 volts. The transistor T2 is not conductive. The voltage at the node A is equal to Vcc-Vt. After this programming and the programming of all the cells of the memory, the contents of the memory can be read.

Figure 3:
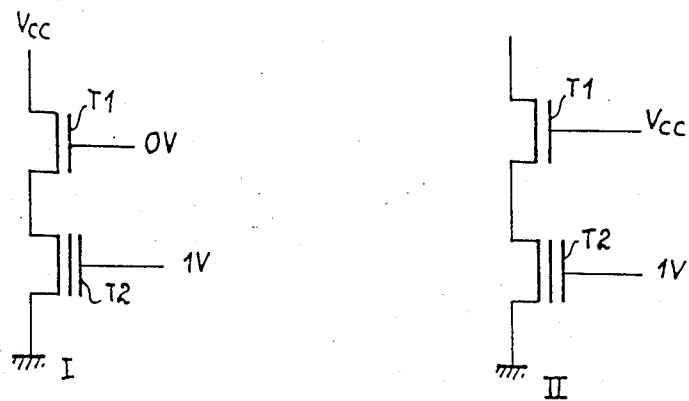
FIGS. 3I and 3II show a detailed diagram of a cell of the memory of the integrated circuit during the reading of this cell.

To read the cells of the memory, for example the cell C1, a standard procedure is used, as shown in FIG. 3:

I—A pre-charging is done by applying the read voltage Vcc to the drain of the access transistor T1, zero volt to its gate, and 1 volt (or two volts) to the gate of the transistor with floating gate, while its source is grounded.

II—Then the reading itself is done, in leaving the drain of the access transistor in a floating state with the read voltage Vcc being applied to its gate, the voltage of 1 volt being applied to the gate of the transistor with floating gate and the source being grounded.

The warning cell CO is read permanently. For this purpose, the drain of the access transistor T1 receives the read voltage Vcc, the control gate of this transistor T1 also receives the read voltage Vcc (as shown in FIG. 2). The transistor T1 is conductive. The voltage at the node A is equal to Vcc-Vt, with the transistor T2 having its gate at zero volt. This transistor T2 is not conductive for as long as the read voltage Vcc is in the range of 5 volts to 10 volts. When this read voltage Vcc rises and becomes excessive, it is all as if a "0" were to be written in the cell. For, although the source of the transistor with floating gate is at zero volt, as soon as the value of the voltage at A reaches the value for programming a cell, namely 10 volts and above, since the gate is at "0", the electrons which were trapped by the programming at "1" tend to leave. The transistor starts to be conductive with its threshold voltage getting lower. The potential of the node A drops.

As a matter of fact, when the read voltage Vcc is raised, the potential of the node A follows this rise until the potential reaches a value which makes the transistor T2 conductive, thus causing the departure of electrons which had been trapped. This phenomenon is similar to the operation for writing a "0" in a cell of a memory: this writing is done in a standard way by applying a voltage of 20 volts to the data line and to the word line and by applying zero volts to the gate of a transistor with floating gate, with the source of this transistor being in a floating state.

On the comparator C the voltage of the node A is applied at the input terminal E1 and the reference voltage is applied at the input terminal E2. This enables it, by comparison with this reference voltage, to detect a drop in voltage at the node A. For, the transistor T2, which is always off with a normal reading voltage, starts to be conductive with an excessive read voltage, and this causes a voltage drop at the drain of this transistor, i.e. at the node A. The voltage Vcc-Vt at this node starts decreasing, and it is this beginning of a voltage drop which is detected by the comparator C. The detection of a voltage drop of 200 mV is enough to prevent the destruction of data contained in the cells of the memory.

So that it is not too late and so that the cells of the memory do not lose any information, during the detection of a drop in voltage at the node A, the programming of the warning cell during the reading operation is speeded up. This cell can be speeded up (made more sensitive), for example, by applying zero volt, during the reading operation, to the gate of the transistor T2 with floating gate while 1 volt or 2 volts are applied to the transistors with floating gates of the cells of the memory. According to another example, instead of using different floating gate voltages, it is possible to use an access transistor T1 of a smaller size than the access transistors of the memory.

Figure 4:
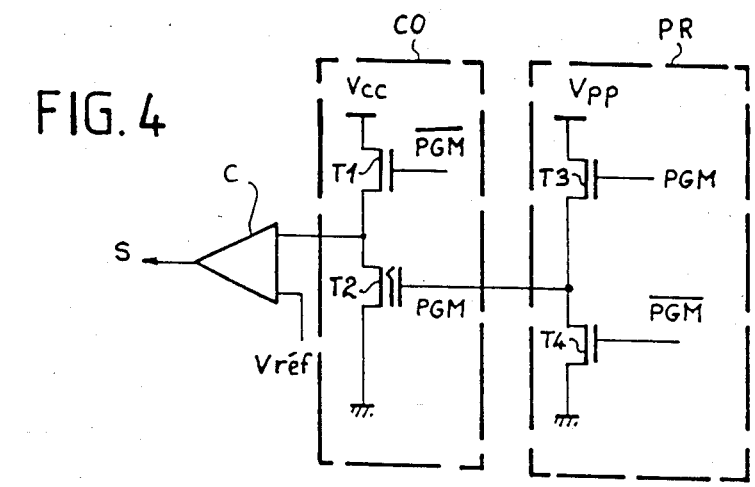
FIG. 4 shows an embodiment of a programming circuit of the warning cell.

FIG. 4 shows a particular example of a circuit which enables the programming or reprogramming of the warning cell. To program the memory cell for the first time in a state "1" or to reprogram it in a state "1", after a voltage drop has been detected at the node A, a programming signal PGM, corresponding to a state "1", i.e. 20 volts, must be applied to the floating gate of transistor T2. The signal applied to the gate of the access transistor T1 should also correspond to a state "0", that is, $\overline{PGM}$, which therefore corresponds to a voltage of zero volt, the drain of T1 being at Vcc and the source of T2 being grounded. The de-programming circuit PR, which is given as an example, is connected, for the programming, to the cell CO. This circuit has two MOS transistors, the transistor T3 and the transistor T4. The drain of the transistor T3 receives the programming voltage Vpp of 20 volts. The gate of this transistor T3 receives the programming signal PGM and the gate of the transistor T4 receives the signal $\overline{PGM}$. The source of T3 and the drain of T4 are connected to each other and to the gate of the transistor with floating gate T2 of the warning cell. When the programming is completed, the signal PGM is at 0 volts and the signal $\overline{PGM}$ is at "1", i.e. 5 volts.

Figure 5:
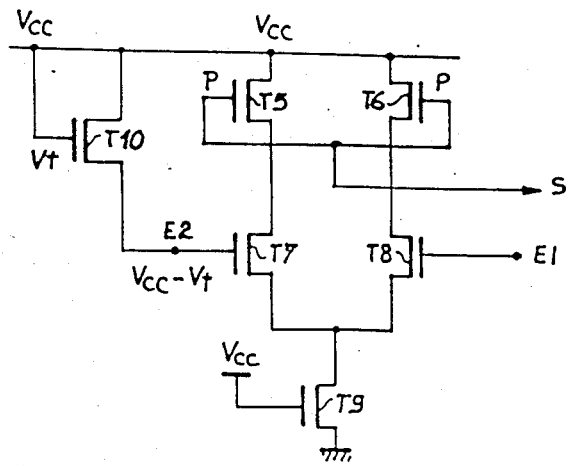
FIG. 5 shows a diagram of a special embodiment of the comparator according to FIG. 2.

FIG. 5 shows a particular example of a sensor/comparator. This comparator C is made with a differential amplifier which is standard per se and comprises transistors T5 to T9. The gate of the transistor T8 and the gate of the transistor T7 respectively form the input terminals E1 and E2. To the input terminal E1 is applied the voltage of the node A, and to the input terminal E2 is applied the reference voltage which corresponds to that of the node A, that is Vcc-Vt, for as long as this node is insulated, i.e. for as long as the transistor T2 does not start conducting. Thus, these voltages are identical for as long as the reading voltage is normal. The differential amplifier is connected between the potentials Vcc and the ground. To obtain the reference voltage Vcc-Vt at the reference input, a transistor T10 is used with its threshold equal to the threshold of the transistor T1, i.e. with a threshold Vt.

When the voltages at E1 and E2 are identical, the currents flowing through the two arms of the amplifier are identical and an output voltage VS of 3 volts, for example, is obtained. When the voltage at E1 drops, the output voltage VS rises to 5 volts, for example.

The output voltage of the comparator makes it possible to turn off the internal clock of the integrated circuit or to trigger an interruption in the internal logic so as to shield the memory as soon as the detected voltage changes. Logic operations of this kind, inside the integrated circuit, are within the scope of those skilled in the art.

What is claimed is:

1. An integrated circuit comprising an electrically erasable programmable memory, the cells of which comprise a transistor with floating gate which is series connected with an access transistor, wherein, in order to prevent deterioration in the information stored in the transistors with floating gates, due to an excessive read voltage being applied to the cell, the circuit has an additional cell constituted like the other cells and programmed in a state where its transistor with floating gate cannot be made conductive, the gate and the source of the transistor with floating gate of the additional cell being grounded, the drain and the gate of the access transistor receiving the memory reading voltage, and a threshold comparator connected to the drain of the floating gate transistor to compare the voltage on this drain with the reading voltage and to give a signal in the event of any abnormal drop in the voltage at the drain.

2. An integrated circuit according to claim 1 wherein the access transistor is an n-channel MOS with a threshold voltage Vt and wherein the comparator gives a signal when the voltage at the drain becomes lower than the reading voltage minus the threshold voltage.

3. An integrated circuit according to claim 1 wherein the access transistor is a p-channel MOS transistor with a threshold voltage Vt and wherein the comparator gives a signal when the voltage on the drain becomes lower than the reading voltage.

* * * * *